(12) United States Patent
Leibfritz et al.

(10) Patent No.: US 10,684,317 B2
(45) Date of Patent: Jun. 16, 2020

(54) VECTOR NETWORK ANALYZER AND MEASURING METHOD FOR FREQUENCY-CONVERTING MEASUREMENTS

(71) Applicant: Rohde & Schwarz GmbH & Co. KG, Munich (DE)

(72) Inventors: Martin Leibfritz, Aying (DE); Werner Held, Pocking (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 77 days.

(21) Appl. No.: 15/823,844

(22) Filed: Nov. 28, 2017

(65) Prior Publication Data

US 2019/0072598 A1    Mar. 7, 2019

Related U.S. Application Data

(63) Continuation-in-part of application No. 15/694,908, filed on Sep. 4, 2017.

(51) Int. Cl.
| | |
|---|---|
| *G01R 27/32* | (2006.01) |
| *G01R 27/06* | (2006.01) |
| *G01R 31/28* | (2006.01) |
| *G01R 35/00* | (2006.01) |

(52) U.S. Cl.
CPC ............. *G01R 27/32* (2013.01); *G01R 27/06* (2013.01); *G01R 31/2824* (2013.01); *G01R 35/007* (2013.01); *G02F 2203/56* (2013.01)

(58) Field of Classification Search
CPC ........ G01R 27/28; G01R 27/32; G01R 27/06; G01R 23/20; G01R 31/2824; G01R 31/2839; G01R 31/2841; G01R 35/007; G02F 2203/56; H03L 7/18; H03L 7/23
See application file for complete search history.

(56) References Cited

U.S. PATENT DOCUMENTS

| | | | |
|---|---|---|---|
| 7,996,184 B2 | 8/2011 | Nakayama et al. | |
| 8,989,243 B1* | 3/2015 | Black | H04B 3/56 375/220 |
| 2008/0018343 A1* | 1/2008 | Hayden | G01D 18/00 324/601 |
| 2009/0061804 A1* | 3/2009 | Chang | H03L 7/099 455/260 |
| 2010/0141305 A1* | 6/2010 | Ortler | G01R 27/28 327/117 |

(Continued)

*Primary Examiner* — Huy Q Phan
*Assistant Examiner* — Dustin R Dickinson
(74) *Attorney, Agent, or Firm* — Potomac Technology Law, LLC

(57) ABSTRACT

A vector network analyzer for obtaining at least one wave frequency ratio with respect to a frequency-converting device under test is provided. The vector network analyzer comprises a transmitter side configured to be controlled by at least one transmitter side clock signal, a receiver side configured to be controlled by at least one receiver side clock signal, and a central clock configured to generate a central clock signal. The at least one transmitter side clock signal and the at least one receiver side clock signal are based on the central clock signal, the at least one transmitter side clock signal and the at least one receiver side clock signal are generated with a fixed phase relation to each other with the aid of a start pulse.

13 Claims, 4 Drawing Sheets

(56) References Cited

U.S. PATENT DOCUMENTS

| | | |
|---|---|---|
| 2010/0204943 A1 | 8/2010 | Heuermann |
| 2012/0105049 A1* | 5/2012 | Ortler ........................ H03L 7/23 |
| | | 324/76.39 |
| 2015/0177300 A1 | 6/2015 | Paech et al. |
| 2015/0303929 A1* | 10/2015 | Hamdane ................ H03L 7/085 |
| | | 327/105 |

* cited by examiner

VECTOR NETWORK ANALYZER AND MEASURING METHOD FOR FREQUENCY-CONVERTING MEASUREMENTS

RELATED APPLICATIONS

This application is a Continuation-in-Part, and claims the benefit of the earlier filing date under 35 U.S.C. § 120, from U.S. patent application Ser. No. 15/694,908 (filed 2017 Sep. 4), the entirety of which is incorporated by reference herein.

TECHNICAL FIELD

The invention relates to a measuring device (e.g., a vector network analyzer) and a measuring method, for obtaining at least one wave frequency ratio, such as scattering parameters (S-parameters), with particular respect to frequency-converting devices under test.

BACKGROUND

Generally, in times of an increasing number of applications employing electrical circuits, such as radio frequency circuits having frequency-converting characteristics, there is a growing need of a vector network analyzer and a measuring method for verifying correct functioning of devices under test applying such circuits.

The patent application publication US 2010/0204943 A1 discloses a vector network analyzer including n test ports. With the connection of several different calibration standards to the test ports, several calibration measurements are implemented. For the calibration, different measurements are implemented. Initially, in n calibration measurements, a comb-generator signal is supplied via a direct connection successively to all n test ports. Using a measuring point at the output of the comb generator and the measuring point associated with the respective test port, phase measurements are implemented at all of the frequencies forming the comb-generator signal. However, as a disadvantage, in order to provide full vector corrected reflection and transmission measurements, especially S-parameter measurements, of a frequency-converting device under test, additional hardware in form of the comb-generator is necessary.

What is needed, therefore, is an approach for a vector network analyzer and measuring method for verifying correct functioning of devices under test having frequency-converting characteristics without additional hardware in an effective and cost-efficient manner.

SOME EXAMPLE EMBODIMENTS

Embodiments of the present invention advantageously address the foregoing requirements and needs, as well as others, by providing a vector network analyzer and measuring method for verifying correct functioning of devices under test having frequency-converting characteristics without additional hardware in an effective and cost-efficient manner.

According to a first aspect of the invention, a vector network analyzer is provided for obtaining at least one wave frequency ratio with respect to a frequency-converting device under test. The vector network analyzer comprises a transmitter side including a first synthesizer and configured to be controlled by at least one transmitter side clock signal, a receiver side including a second synthesizer and configured to be controlled by at least one receiver side clock signal, and a central clock configured to generate a central clock signal. The at least one transmitter side clock signal and the at least one receiver side clock signal are based on the central clock signal and the output signal of the transmitter side and the output signal of the receiver side are generated with a fixed phase relation to each other with the aid of a common start pulse. Advantageously, the vector network analyzer provides full vector corrected measurements with respect to the at least one wave frequency ratio. Further advantageously, the vector network analyzer provides a reproducible phase, especially an absolutely reproducible phase, for each frequency point with respect to the at least one wave frequency ratio.

According to an implementation form of the first aspect, each of the synthesizers comprises a direct digital source configured to generate a reference signal, a voltage controlled oscillator, a phase detector, and an integer divider. The voltage controlled oscillator is configured to receive a voltage from the phase detector in order to generate an oscillator signal, the integer divider is configured to divide the oscillator signal by an integer and even value in order to provide a divided signal. Further, the phase detector is configured to compare the reference signal with the divided signal which is the output signal of the respective synthesizer. Additionally, the synthesizers are controlled by the respective clock signal of the transmitter or the receiver side. Advantageously, the usage of only integer dividers with respect to the synthesizer ensures a reproducible phase, especially an absolutely reproducible phase, of the output signals. Further advantageously, the even value of the integer divider ensures an avoidance of a poly-phase behavior.

According to a further implementation form of the first aspect, at least one of the synthesizers further comprises an additional integer divider configured to divide the divided signal by an integer value in order to provide a further divided signal for the phase detector.

According to a further implementation form of the first aspect, at least one of the transmitter side and the receiver side comprises at least one analog-to-digital converter, wherein the at least one analog-to-digital converter is controlled by the respective clock signal of the transmitter and the receiver side.

According to a further implementation form of the first aspect, at least one of the transmitter side and the receiver side comprises at least one digital-to-analog converter, wherein the at least one digital-to-analog converter is controlled by the respective clock signal of the transmitter and the receiver side.

According to a further implementation form of the first aspect, the at least one wave frequency ratio comprises at least one of scattering parameters (or S-parameters), scattering transfer parameters (or T-parameters), admittance parameters (or Y-parameters), impedance parameters (or Z-parameters), hybrid parameters (or H-parameters), chain, cascade or transmission parameters (or ABCD-parameters), M-parameters, and X-parameters, or equivalent network parameters.

According to a further implementation form of the first aspect, the division ratio with respect to the transmitter side clock signal and the central clock signal and/or the receiver side clock signal and the central clock signal is an integer and even. Advantageously, due to the fact that the division ratio with respect to the transmitter (or receiver side) clock signal and the central clock signal is integer, a reproducible phase, especially an absolutely reproducible phase, of the output signals can be ensured. Further advantageously, due to the fact that the division ratio with respect to the transmitter side (or receiver side) clock signal and the central clock signal is even, an avoidance of a poly-phase behavior can be ensured.

According to a second aspect of the invention, a measuring method is provided for obtaining at least one wave frequency ratio with the aid of a vector network analyzer with respect to a frequency-converting device under test. The measuring method comprises the steps of generating a central clock signal with the aid of a central clock of the vector network analyzer, generating at least one transmitter side clock signal for controlling a transmitter side of the vector network analyzer on the basis of the central clock signal, and generating at least one receiver side clock signal for controlling a receiver side of the vector network analyzer on the basis of the central clock signal. A transmitter side output signal and a receiver side output signal are generated with a fixed phase relation to each other by a respective synthesizer with the aid of a common start pulse provided to all synthesizers. Advantageously, the measuring method provides full vector corrected measurements with respect to the at least one wave frequency ratio. Further advantageously, the measuring method provides a reproducible phase, especially an absolutely reproducible phase, for each frequency point with respect to the at least one wave frequency ratio.

According to an implementation form of the second aspect, the measuring method further comprises, in each synthesizer of the vector network analyzer, the steps of generating a reference signal with the aid of a direct digital source of the synthesizer, receiving a voltage from a phase detector of the synthesizer with the aid of a voltage controlled oscillator of the synthesizer in order to generate an oscillator signal, dividing the oscillator signal by an integer and even value with the aid of an integer divider of the synthesizer in order to provide a divided signal, comparing the reference signal with the divided signal with the aid of the phase detector of the synthesizer, and controlling the synthesizer by the respective clock signal of the transmitter or the receiver side. Advantageously, usage of an integer divider with respect to the synthesizer ensures a reproducible phase, especially an absolutely reproducible phase of the output signals. Further advantageously, the even value of the integer divider ensures an avoidance of a poly-phase behavior.

According to a further implementation form of the second aspect, the method further comprises the steps of further dividing the divided signal by an integer value with the aid of an additional integer divider of the synthesizer, and providing the further divided signal for the phase detector.

According to a further implementation form of the second aspect, the measuring method further comprises the step of controlling at least one analog-to-digital converter of at least one of the transmitter side and the receiver side by the respective clock signal of the transmitter and the receiver side.

According to a further implementation form of the second aspect, the measuring method further comprises the step of controlling at least one digital-to-analog converter of at least one of the transmitter side and the receiver side by the respective clock signal of the transmitter and the receiver side.

According to a further implementation form of the second aspect, the at least one wave frequency ratio comprises at least one of at least one of scattering parameters (or S-parameters), scattering transfer parameters (or T-parameters), admittance parameters (or Y-parameters), impedance parameters (or Z-parameters), hybrid parameters (or H-parameters), chain, cascade or transmission parameters (or ABCD-parameters), M-parameters, and X-parameters, or equivalent network parameters.

According to a further implementation form of the second aspect, the division ratio with respect to the transmitter side clock signal and the central clock signal is integer and even. Advantageously, due to the fact that the division ratio with respect to the transmitter side clock signal and the central clock signal is integer, a reproducible phase, especially an absolutely reproducible phase, can be ensured. Further advantageously, due to the fact that the division ratio with respect to the transmitter side clock signal and the central clock signal is even, an avoidance of a poly-phase behavior can be ensured.

According to a further implementation form of the second aspect, the division ratio with respect to the receiver side clock signal and the central clock signal is integer and even. Advantageously, due to the fact that the division ratio with respect to the receiver side clock signal and the central clock signal is integer, a reproducible phase, especially an absolutely reproducible phase, can be ensured. Further advantageously, due to the fact that the division ratio with respect to the receiver side clock signal and the central clock signal is even, an avoidance of a poly-phase behavior can be ensured.

According to a further implementation form of the second aspect, the method is applied in combination with an Unknown Thru, Open, Short, Match (UOSM) method, or a Short, Open, Load, Reciprocal (SOLR) method, in order to calibrate the frequency-converting device under test.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

Embodiments of the present invention are illustrated by way of example, and not by way of limitation, in the figures of the accompanying drawings, in which like reference numerals refer to similar elements, and in which.

DETAILED DESCRIPTION

A vector network analyzer and measuring method for verifying correct functioning of devices under test having frequency-converting characteristics without additional hardware in an effective and cost-efficient manner are described. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

As will be appreciated, a processor, module or component (as referred to herein) may be composed of software component(s), which are stored in a memory or other computer-readable storage medium, and executed by one or more processors or CPUs of the respective devices. As will also be appreciated, however, a module may alternatively be composed of hardware component(s) or firmware component(s), or a combination of hardware, firmware and/or software components. Further, with respect to the various example embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention. Moreover, the methods, processes and approaches described herein may be processor-implemented using processing circuitry that may comprise one or more microprocessors, application specific integrated circuits (ASICs), field programmable gate arrays (FPGAs), or other devices operable to be configured or programmed to implement the systems and/or methods described herein. For implementation on such devices that are operable to execute software instructions, the flow diagrams and methods described herein may be implemented in processor instructions stored in a computer-readable medium, such as executable software stored in a computer memory store.

Figure 1:
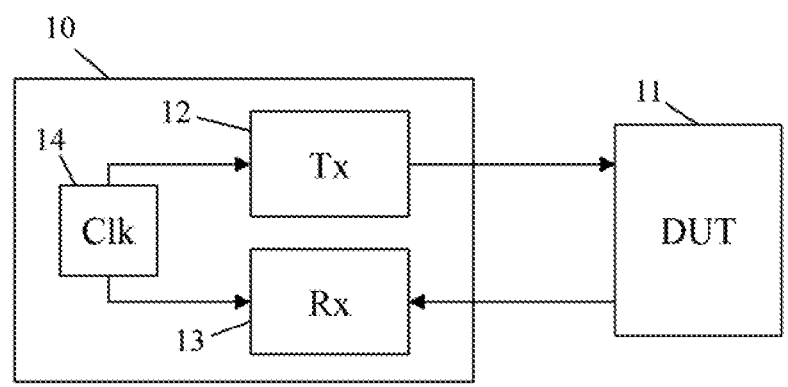
FIG. 1 shows a block diagram of a vector network analyzer according to example embodiments of the present invention.

FIG. 1 shows a block diagram of a vector network analyzer 10 according to example embodiments of the present invention. The vector network analyzer 10 comprises a transmitter side 12, a receiver side 13, and a central clock 14. For obtaining at least one wave frequency ratio with respect to a device under test 11 (such as a frequency-converting device under test), the transmitter side 12 transmits a first signal to the device under test 11, whereas the receiver side 13 receives a second signal (e.g., a frequency-converted and/or further modified version of the first signal) from the device under test. The transmitter side 12 and the receiver side 13 each comprise at least one synthesizer for generating an output signal.

According to such example embodiments, the transmitter side 12 is configured to be controlled by at least one transmitter side clock signal, whereas the receiver side 13 is configured to be controlled by at least one receiver side clock signal. Additionally, the central clock 14 is configured to generate a central clock signal. The at least one transmitter side clock signal and the at least one receiver side signal are based on the central clock signal, wherein the at least one transmitter side clock signal and the at least one receiver side clock signal are generated with a fixed phase relation.

By way of example, the central clock 14 is directly coupled to the transmitter side 12 and to the receiver side 13. By way of further example, each or at least one of the transmitter side clock signal and the receiver side clock signal may be equal to the central clock signal, but in any case both clock signals are derived from the common central clock signal.

According to such example embodiments, due to the fact that the at least one transmitter side clock signal and the at least one receiver side signal are based on the central clock signal, wherein the at least one transmitter side clock signal and the at least one receiver side clock signal are generated with a fixed phase relation to each other. The vector network analyzer 10 provides phase reproducibility of the output signals, especially absolute phase reproducibility. A common start pulse is provided by a controller of the network analyzer for the transmitter side and the receiver side, so that the synthesizers produce these output signals on the basis of their respective clock signals.

In this manner, for obtaining at least one wave frequency ratio with respect to the device under test 11, the vector network analyzer 10 advantageously provides full vector corrected reflection and transmission measurements, such as scattering parameter (S-parameter) measurements, of the device under test 11 which does a frequency-conversion.

Further, obtaining the at least one wave frequency ratio does not only comprise S-parameter measurements but may also comprise measuring scattering transfer parameters (or T-parameters), admittance parameters (or Y-parameters), impedance parameters (or Z-parameters), hybrid parameters (or H-parameters), chain, cascade or transmission parameters (or ABCD-parameters), M-parameters, or X-parameters, or equivalent network parameters, or any combination thereof.

In this context, the vector network analyzer 10, or another vector network analyzer according to example embodiments of the present invention, does not only allow for frequency-converting measurements (e.g., frequency-converting measurements on mixers), but also for analyzing intermodulation, harmonics, response of the device under test 11, or the like, since these signals are measured with respect to a reference such as a fundamental tone.

Further, with respect to the vector network analyzer 10, or another vector network analyzer according to example embodiments of the present invention, all signals generated or processed in each of the synthesizers may be related to each other by a divisor of an integer, such as an even integer. The usage of an integer ensures phase reproducibility of the output signals, especially absolute phase reproducibility, and using an even integer additionally allows for an avoidance of a poly-phase behavior.

Figure 2:
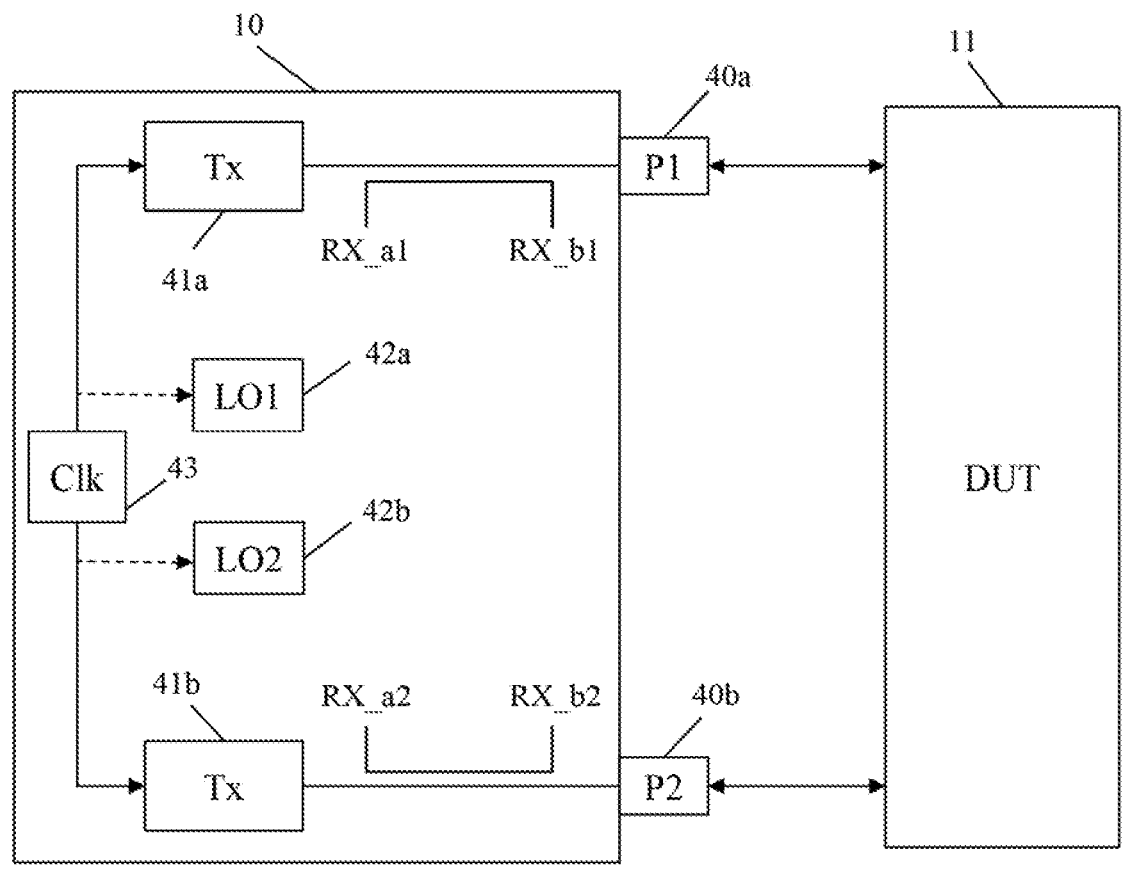
FIG. 2 shows a further block diagram of a vector network analyzer according to example embodiments of the present invention.

FIG. 2 shows a further block diagram of a vector network analyzer 10 according to example embodiments of the present invention.

The vector network analyzer 10 comprises a first measuring port 40a and a second measuring port 40b, each of which is connected to the device under test 11. In addition to this, the vector network analyzer 10 further comprises a first transmitter side synthesizer 41a, a second transmitter side synthesizer 41b, a first receiver side synthesizer in the form of a first a first local oscillator 42a, a second receiver side synthesizer in the form of a second local oscillator 42b, and a central clock 43.

The central clock 43 is configured to generate a central clock signal, each of the first transmitter side synthesizer 41a, the second transmitter side synthesizer 41b, the first local oscillator 42a and the second local oscillator 42b is connected to the central clock 43, and configured to be controlled on the basis of the central clock signal generated by the central clock 43. Additionally, the first transmitter side synthesizer 41a is connected to the first measuring port 40a, and the second transmitter side synthesizer 41b is connected to the second measuring port 40b.

In this context, each of the measuring ports 40a and 40b is configured to receive a reference signal of the respective transmitted signal ("a-wave" represented by variables RX_a1 and RX_a2) and/or to receive a measurement signal of a signal reflected or transmitted by the device under test 11 ("b-wave" represented by variables RX_b1 and RX_b2 in FIG. 2).

In a simple example measurement application, employing one measuring port of the measuring ports 40a and 40b, the used measuring port emits the above-mentioned a-wave and then receives the corresponding b-wave.

In a further example measurement application, both measuring ports 40a and 40b are used. In this case, a test signal is transmitted to the device under test 11 with the aid of the first measuring port 40a, and an output signal of the device under test 11 is measured with the aid of the second measuring port 40b. In this context, with respect to the test signal transmitted to the device under test, the respective a-wave (e.g., the variable RX_a1) is measured, and with respect to the output signal of the device under test 11, the respective b-wave (e.g., the variable RX_b2) is measured. By way of example, advantageously, a wave frequency ratio in the form of a quotient of RX_b2 and RX_a1 may be determined. By way of further example, advantageously, with respect to this or other measurement applications, wave frequency ratios in the form of a quotient of RX_b1 and RX_a2, a quotient of RX_b1 and RX_a1, a quotient of RX_b2 and RX_a2, or their corresponding reciprocals may be determined.

Figure 3:
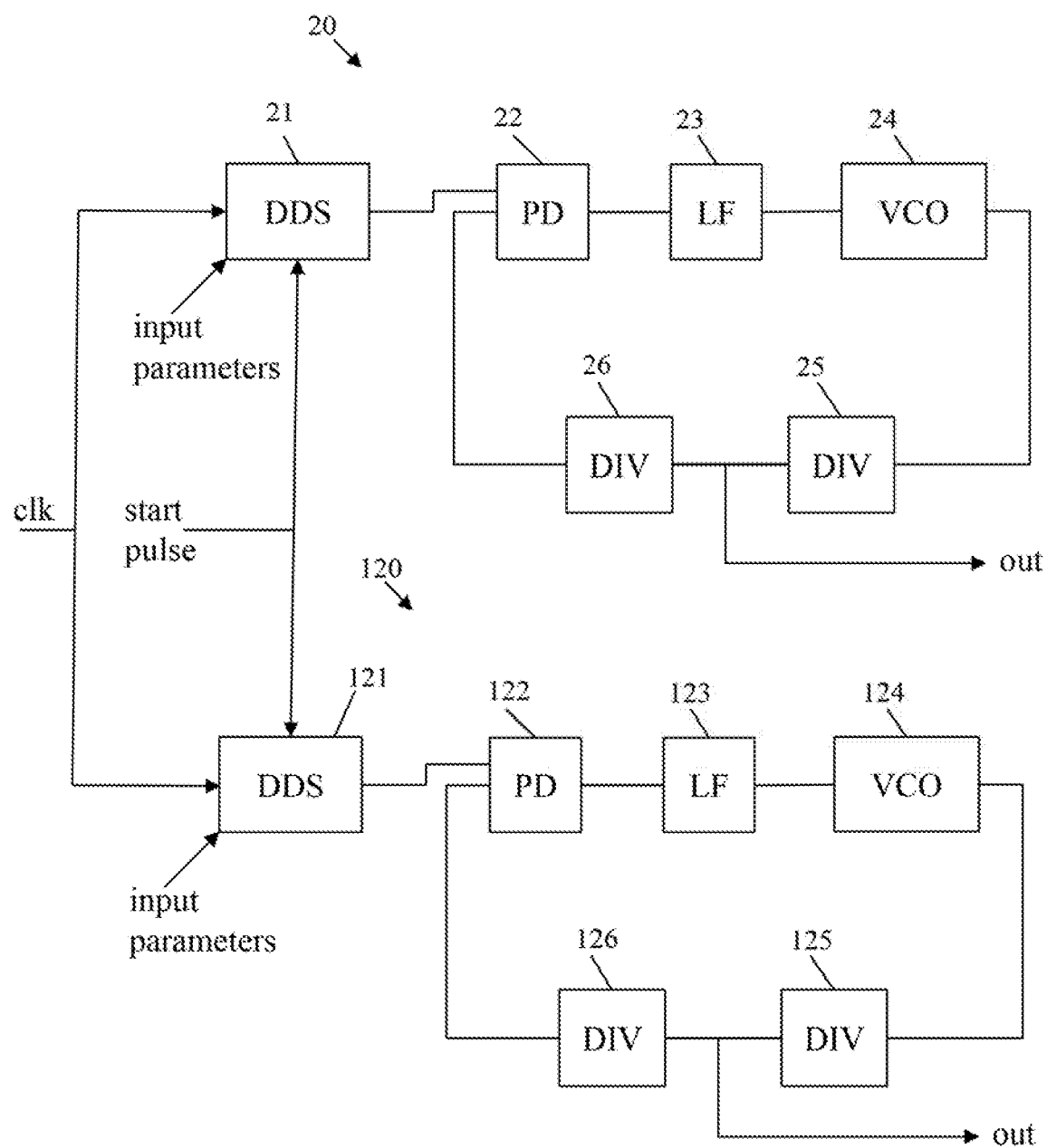
FIG. 3 shows a block diagram of a synthesizer of a vector network analyzer according to example embodiments of the present invention.

FIG. 3 shows a block diagram of a synthesizer 20 of a vector network analyzer according to example embodiments of the present invention. The transmitter side 12 of the vector network analyzer 10 and/or the receiver side 13 of the vector network analyzer 10 may include at least one synthesizer 20, 120, respectively. With reference to FIG. 3, the transmitter side synthesizer 20 and receiver side synthesizer 120 are shown. In this context, the synthesizers 20, 120 may be controlled by the respective one of the at least one transmitter side clock signal or the respective one of the at least one receiver side clock signal. Further, the above-mentioned measurement applications (e.g., where all signals generated or processed in each of the synthesizers are related to each other by an integer divisor, such as an even integer) applies for the transmitter side synthesizer 20 and the receiver side synthesizer 120. By way of example, advantageously, one or more of the transmitter side clock signal, the receiver side clock signal, the central clock signal, signals within the loop of the transmitter side synthesizer 20, and signals within the loop of the receiver side synthesizer 120 are related to each other by an integer divisor (e.g., an even integer). In this context, the relation of an integer (e.g., an even integer) does not necessarily apply for input and output signals of the device under test 11.

The following explanation, regarding the transmitter side synthesizer 20, also applies to the receiver side synthesizer 120, where the descriptions for the elements denoted by reference numerals 2x of the transmitter side synthesizer 20 similarly apply to the elements denoted by reference numerals 12x of the receiver side synthesizer 120.

The synthesizer 20 comprises a direct digital source 21, a phase detector 22, a loop filter 23, a voltage controlled oscillator 24, an integer divider 25, and an additional integer divider 26.

By way of example, the direct digital source 21 is configured to generate a reference signal, which is fed to a first input of the phase detector 22. Further, whereas an output of the phase detector 22 is connected to an input of the loop filter 23, an output of the loop filter 23 is connected to an input of the voltage controlled oscillator 24. Moreover, whereas an output of the voltage controlled oscillator 24 is connected to an input of the integer divider 25, an output of the integer divider 25 is connected to an input of the additional integer divider 26. Additionally, an output of the additional integer divider 26 is connected to a second input of the phase detector 22.

By way of further example, the direct digital source 21 is configured to generate a reference signal at its output, wherein the reference signal is based on a direct digital source clock signal "clk", which is fed to a first input of the direct digital source 21, and input parameters, which are fed to a second input of the direct digital source 21. The input parameters may be digital words (e.g., 8-bit, 16-bit or 32-bit words), which comprise information with respect to a certain waveform such as quantized samples of a sine function. Additionally, the reference signal being outputted by the direct digital source 21 may reflect the certain waveform.

In this context, the direct digital source clock signal is based on the central clock signal of the central clock 14 of the vector network analyzer 10. The direct digital source clock signal may be equal to the central clock signal of the central clock 14 of the vector network analyzer 10. In the illustrated embodiment, both synthesizers receive as transmitter side clock signal and receiver side clock signal the central clock signal without any further processing such as dividing.

Additionally or alternatively, for controlling the synthesizer 20, the direct digital source clock signal may also be provided for at least one of the following components of the synthesizer 20: phase detector 22, loop filter 23, voltage controlled oscillator 24, integer divider 25, and additional integer divider 26. In this case, the respective ones of these components may be configured to receive the direct digital source clock signal. Further, the respective ones of these components may provide an additional input for inputting the direct digital source clock signal.

Further, the above-mentioned processing of signals may comprise at least one of the following operations: adding, subtracting, multiplying, and dividing.

Additionally, with further reference to FIG. 3, the direct digital source 21 comprises a third input for inputting a start pulse. With the aid of the start pulse, a fixed phase relation between the output signals of the transmitter side 12 and of the receiver side 13 of the vector network analyzer 10 can be ensured. Further, the start pulse is also provided to receiver side synthesizer 120, thus the start pulse simultaneously resets the components of the synthesizers 20, 120. In this context, by way of example, advantageously, sampling components on the receiver side (e.g., a plurality or each of the respective analog-to-digital converters on the receiver side) are coupled to the central clock and/or also receive the start pulse.

Additionally, at least one of the following components of the synthesizer 20 may be provided with the start pulse: phase detector 22, loop filter 23, voltage controlled oscillator 24, integer divider 25, and additional integer divider 26. In this case, the respective ones of these components may provide an additional start pulse input for inputting the start pulse.

Advantageously, the vector network analyzer 10 provides full vector corrected reflection and transmission measurements with respect to the at least one wave frequency ratio. Further advantageously, the vector network analyzer 10 provides a reproducible phase, especially an absolutely reproducible phase, for each frequency point with respect to the at least one wave frequency ratio.

By way of further example, the voltage controlled oscillator 24 is configured to receive a filtered voltage from the output of the loop filter 23 with the aid of the input of the voltage controlled oscillator 24. The loop filter 23 is configured to receive a voltage from the output of the phase detector 22, to adequately filter the output voltage of the phase detector 22, and to pass the filtered voltage to the voltage controlled oscillator 24. Adequately filtering the voltage outputted by the phase detector 22 may comprise at least one of the following operations: low-pass filtering, high-pass filtering, band-pass filtering, and amplifying. Alternatively, the loop filter 23 may be substituted by an amplifier, such as a loop amplifier. Further alternatively, the loop filter 23 may be omitted, and the output of the phase detector 22 may directly be connected to the input of the voltage controlled oscillator 24.

By way of further example, the voltage controlled oscillator 24 is configured to receive the filtered voltage, alternatively amplified voltage, further alternatively the voltage, is further configured to generate an oscillator signal at its output being connected to the input of the integer divider 25.

By way of further example, the integer divider 25 is configured to divide the oscillator signal by an integer and even value in order to provide a divided signal which is not only used as an output signal "out" of the synthesizer 20 and provided for measurements with the aid of the vector network analyzer 10, but also passed to the input of the additional integer divider 26. The additional integer divider 26 is configured to further divide the divided signal by an integer value, such as an even integer value, in order to provide a further divided signal for the second input of the phase detector 22.

By way of further example, the phase detector 22 is configured to compare the reference signal with the further divided signal with special respect to the phases of the signals.

Figure 4:
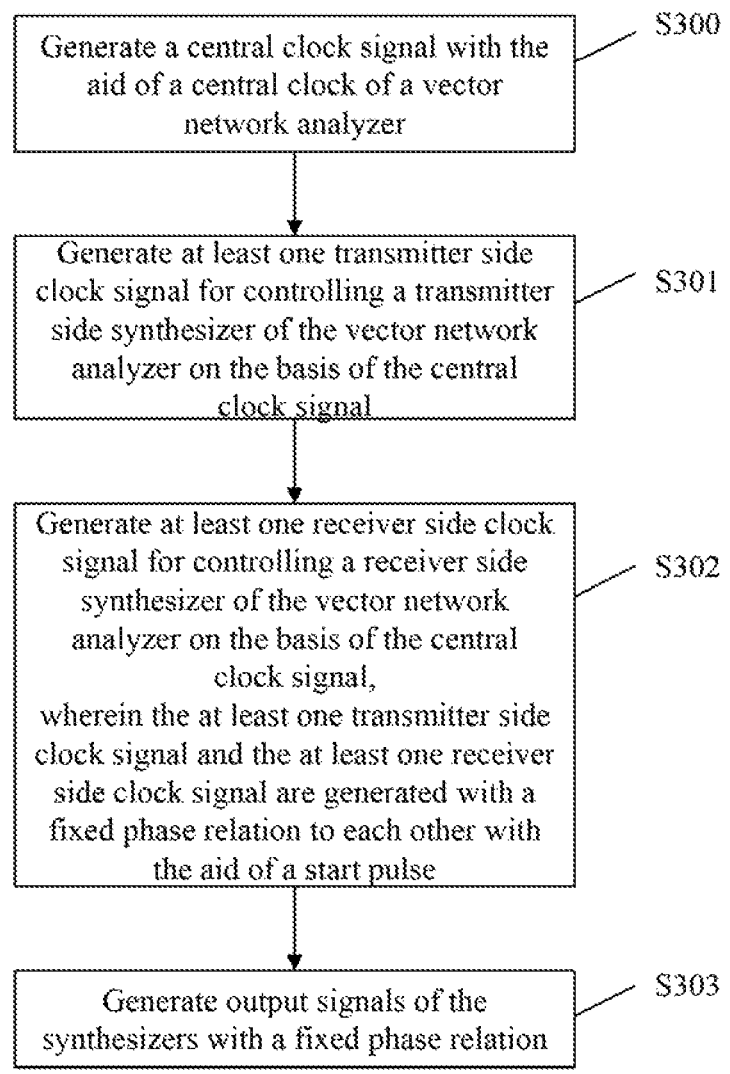
FIG. 4 shows a flow chart of measuring method according to example embodiments of the present invention.

FIG. 4 shows a flow chart of measuring method according to example embodiments of the present invention. In step S300, a central clock signal is generated with the aid of a central clock of a vector network analyzer. In step S301, at least one transmitter side clock signal is generated for controlling a transmitter side of the vector network analyzer on the basis of the central clock signal. In step S302, at least one receiver side clock signal is generated for controlling a receiver side of the vector network analyzer on the basis of the central clock signal, wherein the at least one transmitter side clock signal and the at least one receiver side clock signal are generated with a fixed phase relation to each other. In step S303 the synthesizers of the vector network analyzer generate, controlled by the input clock signals, output signals having a reproducible and fixed phase relation. The output signals have the same fixed relation to each other every time a start pulse is received by the synthesizers. In this context, at least two of the central clock signals, the at least one transmitter side clock signal and the at least one receiver side clock signal are mentioned sequentially only to point out that the generation of the clock signals is performed in individual method steps. Generation of the receiver side and the transmitter side clock signals is started independent from each other after power-on of the network analyzer.

Further, advantageously, using a measuring method according to example embodiments of the present invention in combination with an Unknown Thru, Open, Short, Match (UOSM) method, devices under test (e.g., frequency-converting devices under test) can be calibrated in manner of improved efficiency, due to the fact that performing calibration in this manner is as efficient as for non-frequency-converting devices under test. In this context, by way of example, advantageously, the unknown through-connection may be represented by the device under test itself (e.g., in the case for mixers), which achieves the advantage that there is no need of an additional calibration standard. In addition to this, as an alternative for the UOSM method, a Short, Open, Load, Reciprocal (SOLR) method may be applied.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A vector network analyzer for obtaining at least one wave frequency ratio with respect to a frequency-converting device under test, the vector network analyzer comprising:
    a transmitter, including a transmitter synthesizer, configured to be controlled by at least one transmitter clock signal;
    a receiver, including a receiver synthesizer, configured to be controlled by at least one receiver clock signal; and
    a clock generator configured to generate a central clock signal; and
    wherein the at least one transmitter clock signal and the at least one receiver clock signal are based on the central clock signal,
    wherein an output signal of the transmitter synthesizer and an output signal of the receiver synthesizer are generated with a fixed phase relation to each other with the aid of a common start pulse,
    wherein each of the transmitter synthesizer and the receiver synthesizer comprises a direct digital source, a voltage controlled oscillator, a phase detector, and a first integer divider,
    wherein each of the direct digital sources is configured to generate a reference signal,
    wherein each of the voltage controlled oscillators is configured to receive a voltage from the respective phase detector to generate an oscillator signal,
    wherein each of the first integer dividers is configured to divide the respective oscillator signal by an even integer to generate a first divided signal as an output signal of the transmitter synthesizer and of the receiver synthesizer, respectively, and to provide the first divided signal as an input signal to the respective phase detector,
    wherein at least one of the transmitter synthesizer and the receiver synthesizer further comprises a second integer divider configured to divide the respective first divided signal by an integer value to generate a second divided signal and to provide the second divided signal, instead of the respective first divided signal, as the input signal to the respective phase detector of the respective transmitter synthesizer and receiver synthesizer, wherein each of the phase detectors is configured to compare the respective reference signal with the respective input signal, and wherein each of the first and second integer dividers includes a start pulse input configured to receive the common start pulse.

2. The vector network analyzer according to claim 1, wherein at least one of the transmitter and the receiver comprises at least one analog-to-digital converter, wherein the at least one analog-to-digital converter is controlled by the respective clock signal of the transmitter and the receiver.

3. The vector network analyzer according to claim 1, wherein at least one of the transmitter and the receiver comprises at least one digital-to-analog converter, wherein the at least one digital-to-analog converter is controlled by the respective clock signal of the transmitter and the receiver.

4. The vector network analyzer according to claim 1, wherein the at least one wave frequency ratio comprises one or more of S-parameters, T-parameters, Y-parameters, Z-parameters, H-parameters, ABCD-parameters, M-parameters, X-parameters, and equivalent network parameters.

5. The vector network analyzer according to claim 1, wherein a division ratio with respect to the transmitter clock signal and the central clock signal is an even integer.

6. The vector network analyzer according to claim 1, wherein a division ratio with respect to the receiver clock signal and the central clock signal is an even integer.

7. A measuring method for obtaining at least one wave frequency ratio with respect to a frequency-converting device under test using a vector network analyzer, the measuring method comprising:

generating a central clock signal with the aid of a central clock of the vector network analyzer;

generating at least one transmitter clock signal for controlling a transmitter of the vector network analyzer based on the central clock signal;

generating at least one receiver clock signal for controlling a receiver of the vector network analyzer based on the central clock signal;

generating an output signal of the transmitter and an output signal of the receiver, respectively, by a transmitter synthesizer and a receiver synthesizer with a fixed phase relation to each other with the aid of a common start pulse, and generating, in each of the transmitter synthesizer and the receiver synthesizer, a reference signal with the aid of a direct digital source of the respective synthesizer;

receiving, in each of the transmitter synthesizer and the receiver synthesizer, a voltage from a phase detector of the respective synthesizer to generate an oscillator signal with the aid of a voltage controlled oscillator of the respective synthesizer;

dividing, in each of the transmitter synthesizer and the receiver synthesizer, the respective oscillator signal by an even integer with the aid of a first integer divider of the respective synthesizer to generate a first divided signal as an output signal of the transmitter synthesizer and of the receiver synthesizer, respectively, and providing the respective first divided signal as an input signal to the phase detector of the respective synthesizer;

dividing, in at least one of the transmitter synthesizer and the receiver synthesizer, the respective first divided signal by an integer value with the aid of a second integer divider of the respective synthesizer to generate a second divided signal, and providing the second divided signal, instead of the respective first divided signal, as the input signal to the phase detector of the respective synthesizer;

receiving, by each of the respective first and second integer dividers of the transmitter and receiver synthesizers, the common start pulse; and comparing, in each of the transmitter synthesizer and the receiver synthesizer, the respective reference signal with the respective input signal with the aid of the phase detector of the respective synthesizer.

8. The measuring method according to claim 7, further comprising:

controlling at least one analog-to-digital converter of at least one of the transmitter and the receiver by the respective clock signal of the transmitter and the receiver.

9. The measuring method according to claim 7, further comprising:

controlling at least one digital-to-analog converter of at least one of the transmitter side and the receiver side by the respective clock signal of the transmitter and the receiver side.

10. The measuring method according to claim 7, wherein the at least one wave frequency ratio comprises one or more of S-parameters, T-parameters, Y-parameters, Z-parameters, H-parameters, ABCD-parameters, M-parameters, X-parameters, and equivalent network parameters.

11. The measuring method according to claim 7, wherein a division ratio with respect to the transmitter clock signal and the central clock signal is an even integer.

12. The measuring method according to claim 7, wherein a division ratio with respect to the receiver clock signal and the central clock signal is an even integer.

13. The measuring method according to claim 7, wherein the method is applied in combination with an Unknown Thru, Open, Short, Match (UOSM) method or a Short, Open, Load, Reciprocal (SOLR) method in order to calibrate the frequency-converting device under test.

* * * * *